(12) United States Patent
Hwang et al.

(10) Patent No.: US 6,238,160 B1
(45) Date of Patent: May 29, 2001

(54) METHOD FOR TRANSPORTING AND ELECTROSTATICALLY CHUCKING A SEMICONDUCTOR WAFER OR THE LIKE

(75) Inventors: Yuan-Ko Hwang, Hualien; Tsung-Chi Hsieh, Taipei, both of (TW)

(73) Assignee: Taiwan Semiconductor Manufacturing Company, Ltd', Hsin Chu (TW)

( * ) Notice: Subject to any disclaimer, the term of this patent is extended or adjusted under 35 U.S.C. 154(b) by 0 days.

(21) Appl. No.: 09/204,614

(22) Filed: Dec. 2, 1998

(51) Int. Cl.$^7$ ................................................. B65G 49/07
(52) U.S. Cl. .................. 414/217; 414/749; 414/935; 414/941; 29/25.01
(58) Field of Search .................... 414/217, 416, 414/937, 939, 744.5, 935, 936, 941, 816, 749; 29/25.01

(56) References Cited

U.S. PATENT DOCUMENTS

| | | | |
|---|---|---|---|
| 4,645,218 | * 2/1987 | Ooshio et al. | 279/1 M |
| 5,258,047 | * 11/1993 | Tokisue et al. | 29/25.01 |
| 5,315,473 | * 5/1994 | Collins et al. | 361/234 |
| 5,444,597 | * 8/1995 | Blake et al. | 361/234 |
| 5,485,644 | * 1/1996 | Shinbara et al. | 15/21.1 |
| 5,792,304 | * 8/1998 | Tamura et al. | 156/345 |
| 5,818,682 | * 10/1998 | Loo | 361/234 |
| 5,932,014 | * 8/1999 | Hayashi et al. | 118/719 |
| 6,032,083 | * 2/2000 | Oosawa | 700/218 |
| 6,048,434 | * 4/2000 | Tamura et al. | 156/345 |

* cited by examiner

*Primary Examiner*—Douglas Hess
*Assistant Examiner*—Joseph A. Fischetti
(74) *Attorney, Agent, or Firm*—Tung & Associates

(57) ABSTRACT

An electrically conductive workpiece such as a semiconductor wafer or the like is transported between a staging area and an electrostatic chuck within a processing chamber using an electrostatic arm. The arm is used to apply an electrical charge to the wafer and to hold the wafer during transport by means of an electrostatic force of attraction between the arm and the wafer. The arm also pre-charges the wafer in preparation to be electrostatically chucked within the processing chamber. Pre-charging the wafer eliminates the need for using a gas plasma within the chamber for chucking and dechucking the wafer.

4 Claims, 5 Drawing Sheets

METHOD FOR TRANSPORTING AND ELECTROSTATICALLY CHUCKING A SEMICONDUCTOR WAFER OR THE LIKE

TECHNICAL FIELD

The present invention generally relates to methods and techniques for processing semiconductor devices, such as semiconductor wafers, and deals more particularly with a method for transporting and electrostatically chucking the wafer for processing within a processing chamber.

BACKGROUND OF THE INVENTION

Semiconductor wafers used to fabricate integrated circuits are processed in vacuum chambers using common semiconductor processing techniques, such as CVD, sputtering and etching. The wafer must be securely held in a fixed position within the chamber, and means must be provided to carefully control the temperature of the wafer. In many cases, a cooling gas, such as helium is supplied to the backside of the wafer which serves as a heat transfer medium to assist in controlling wafer temperature.

Various techniques have been used in the past to hold the wafer in a desired position within the chamber. Early techniques involved mechanically clamping the topside of the wafer while providing cooling gasses to the backside; this approach is sometimes referred to as "top side clamping", but has not proved particularly effective, in large part because it suffers from the disadvantage of causing non-uniformity and particle inconsistencies at the extreme edge of the wafer.

More recently, electrostatic clamping has found increasing use. This technique makes use of the electrostatic attraction between objects of different electrical potentials, and commonly employs an electrostatic chuck as the device for providing electrostatic clamping forces. Electrostatic chucking is based on the forces of attraction between the charged plates of a capacitor. As in other types of wafer clamping and chucking, cooling gasses to control wafer temperature are supplied to the backside of the wafer, consequently the clamping force resulting from electrostatic forces must be sufficient to overcome the backside pressure on the wafer resulting from application of the heat transfer medium. The electrostatic chuck can be thought of as a capacitor with a conductive plate (a lower electrode fixed within the processing chamber), an insulating layer (a coating on the electrode), and another conductive plate (the wafer). In effect, the chuck is a parallel plate capacitor with a dielectric spacer. In its simplest form, this type of electrostatic chuck is referred to as a unipolar or monopolar electrostatic chuck. A unipolar electrostatic chuck is simply a conducting electrode with the wafer being employed as one of the conducting plates. In order to establish a complete circuit, an electrical connection to the wafer is required.

Currently, electrostatic chucking methods use the gas plasma within the chamber as a conductor which completes the electrical circuit necessary to provide the electrostatic clamping force. A significant drawback of this method is the fact that the actual clamping force is not applied to the wafer until the wafer has been charged and the plasma has been generated in the chamber, the combination of which results in "chucking" the wafer on the electrode. Although an electrical conductor could be used to contact the wafer in lieu of the electrically conductive plasma, such contact could have serious consequences in terms of process reliability and reproducibility. After the wafer is electrostatically "chucked", the desired process is carried out in the chamber, following which it is necessary to unclamp the wafer. Wafer unclamping is achieved by removing the plasma from the chamber and bleeding off the electrical charge existing in the wafer; this step is commonly referred to as "de-chucking" the wafer. The speed and effectiveness of de-chucking are highly dependent upon the particular processes that have been previously carried out in the chamber. Simply turning off the voltage source to the chuck electrode with the plasma still present will not always result in instantaneous de-chucking since some residual charge may remain in the wafer. In any event, in addition to less than optimal process repeatability, the time required for chucking and de-chucking the wafer necessarily increases the overall time required to process a particular wafer, and thus reduces wafer throughput to the system.

It would therefore be desirable to provide an electrostatic chucking method which is capable of chucking and de-chucking the wafer without the need for using the plasma within the chamber to complete the circuit necessary for creating the electrostatic chucking force. The present invention is directed to satisfying this requirement.

SUMMARY OF THE INVENTION

According to one aspect of the present invention, a method is provided for transporting and electrostatically chucking an electrically conductive workpiece such as a semiconductor wafer for processing in a chamber. The method includes loading the wafer onto an arm or carrier using a first electrostatic force to attract the wafer to the carrier; transporting the wafer from a staging area to the processing chamber using the carrier; removing the first electrostatic force whereby to release the wafer from the carrier; depositing the wafer onto an electrically conductive substrate; creating a second electrostatic force between the substrate and the wafer which causes the wafer to be electrostatically chucked onto the substrate; then, following processing of the wafer in the chamber, removing the second electrostatic force and loading the wafer onto the carrier using the first electrostatic force to attract the wafer to the carrier; and, transporting the wafer from the chamber back to the staging area using the carrier.

According to another aspect of the invention, a method is provided for transporting and electrostatically chucking an electrically conductive workpiece such as a semiconductor wafer for processing in a chamber, comprising the steps of: loading a wafer onto a carrier; charging the wafer with a first electrical polarity; transporting the wafer from a staging area to a processing chamber using the carrier; charging an electrically conductive substrate within the chamber with a second polarity opposite of the first polarity; loading the charged wafer onto the oppositely charged substrate; holding the wafer on the substrate using an electrostatic force; then, following processing in a chamber, reversing the polarity of the electrical charge on the substrate, thereby creating an electrostatic repulsion force between the wafer and the substrate; loading the wafer onto the carrier; and, transporting the wafer from the processing chamber area back to the staging area using the carrier.

Accordingly it is the primary object of the present invention to provide a method for transporting and an electrostatically clamping a wafer within a semiconductor processing chamber which eliminates the need for utilizing gas plasma within the chamber as a conducting medium for creating electrostatic clamping forces.

Another object of the invention is to provide a method of the type mentioned above which is substantially decreases the time required for chucking and de-chucking the wafer within the processing chamber.

A further object of the invention is to provide a method as described above which allows transport of the wafer without the need for applying mechanical clamping forces to the wafer.

A still further object of the present invention is to provide a method of the type described above which provides highly repeatable and consistent results.

These, and further objects and advantages of the present invention will be made clear or will become apparent during the course of the following description of a preferred embodiment of the present invention.

DETAILED DESCRIPTION OF THE PREFERRED EMBODIMENT

Figure 4:
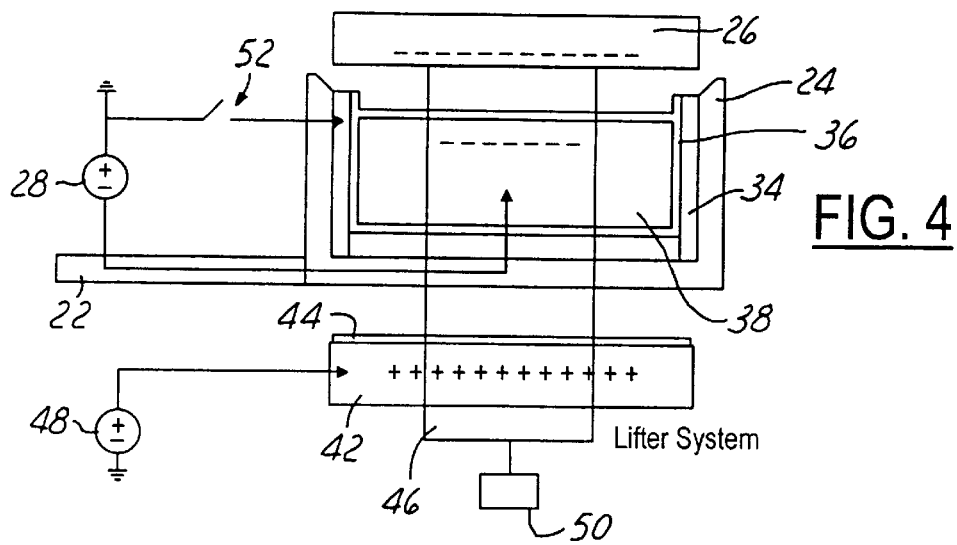
FIG. 4 is a view similar to FIG. 3 but showing the wafer lifted off of the arm.
Figure 5:
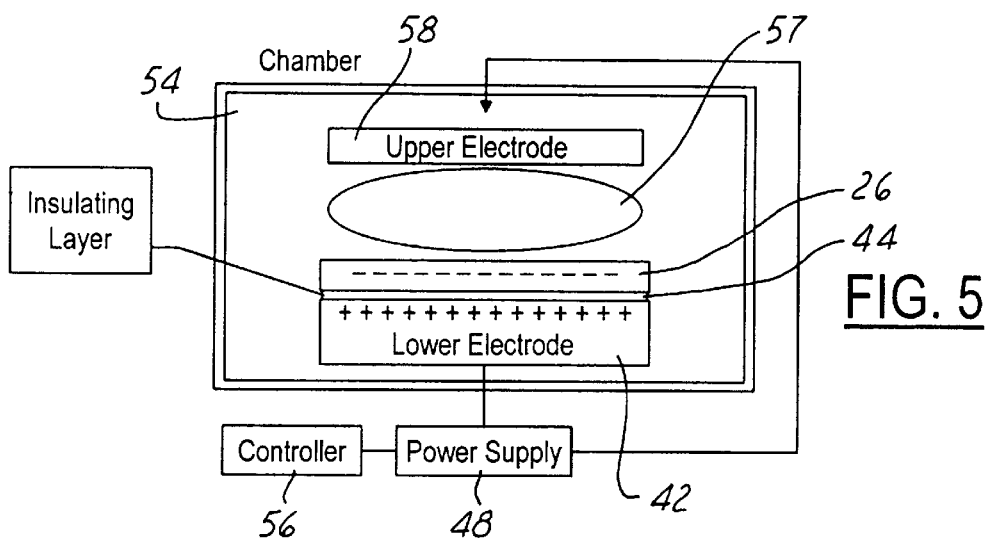
FIG. 5 is a combined block and diagrammatic view of a semiconductor processing chamber, and showing the wafer electrostatically clamped on the electrode within the chamber.
Figure 6:
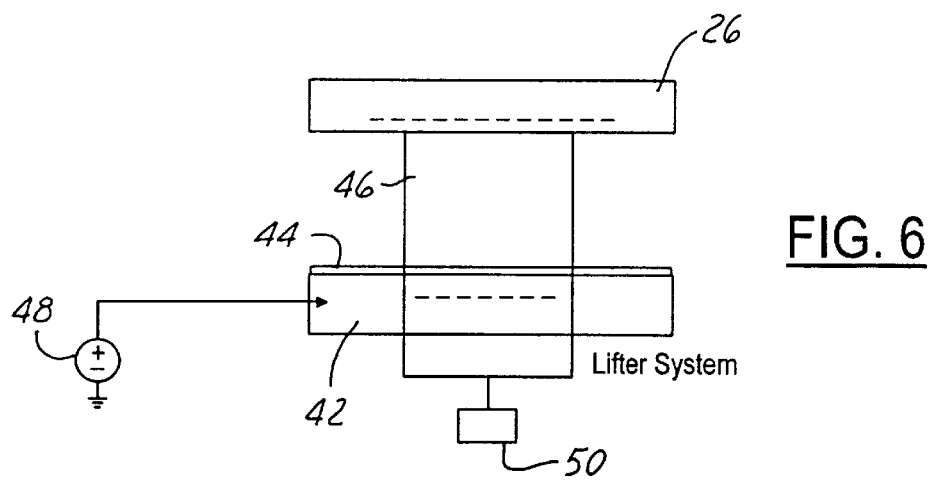
FIG. 6 is a diagrammatic view showing the wafer raised by the lifting mechanism above the electrode.
Figure 7:
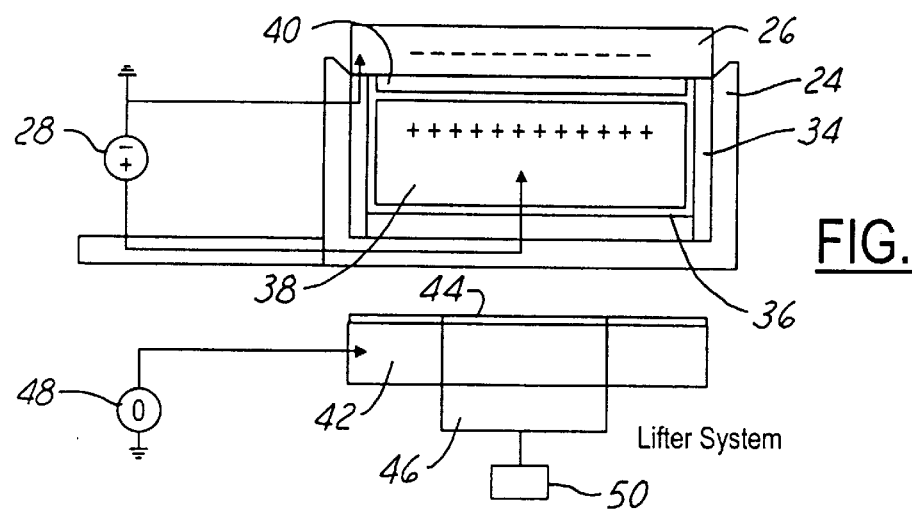
FIG. 7 is a view similar to FIG. 3 but showing a subsequent step in the inventive method.
Figure 8:
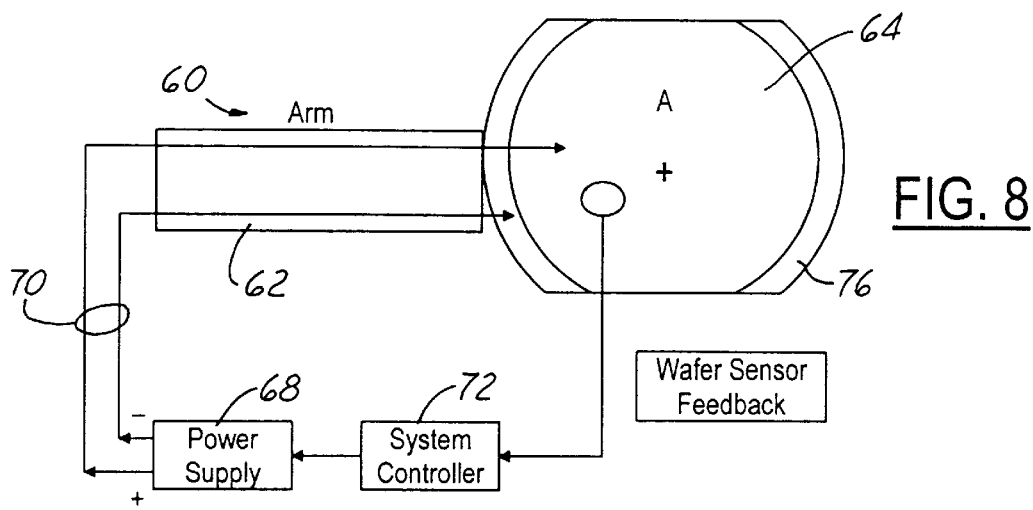
FIG. 8 is a combined block and diagrammatic view of an alternate form of an electrostatic carrier arm useful in carrying out the method of the present invention.
Figure 9:
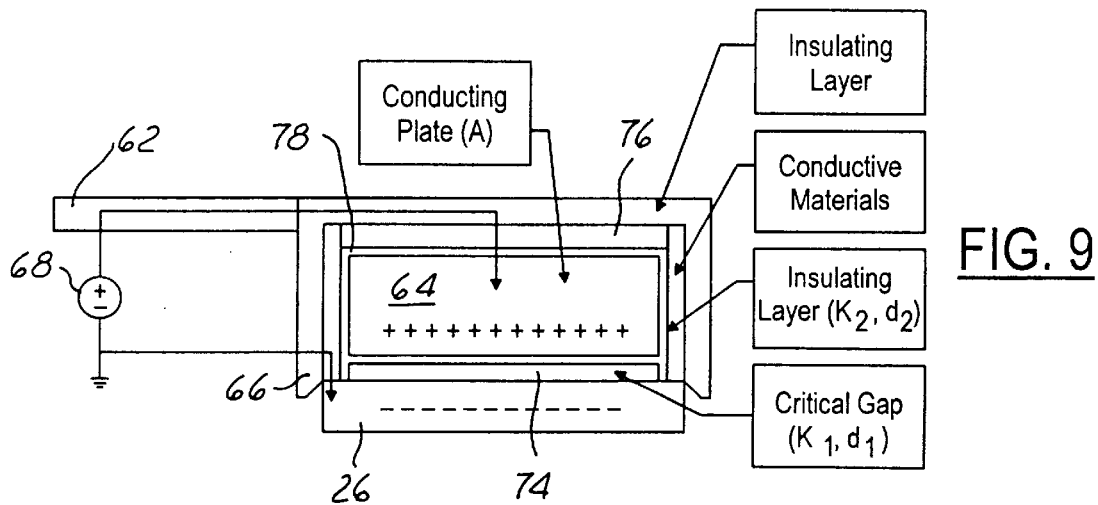
FIG. 9 is a combined schematic and cross sectional view of the arm of FIG. 8 showing the wafer electrostatically clamped on the arm.
Figure 10:
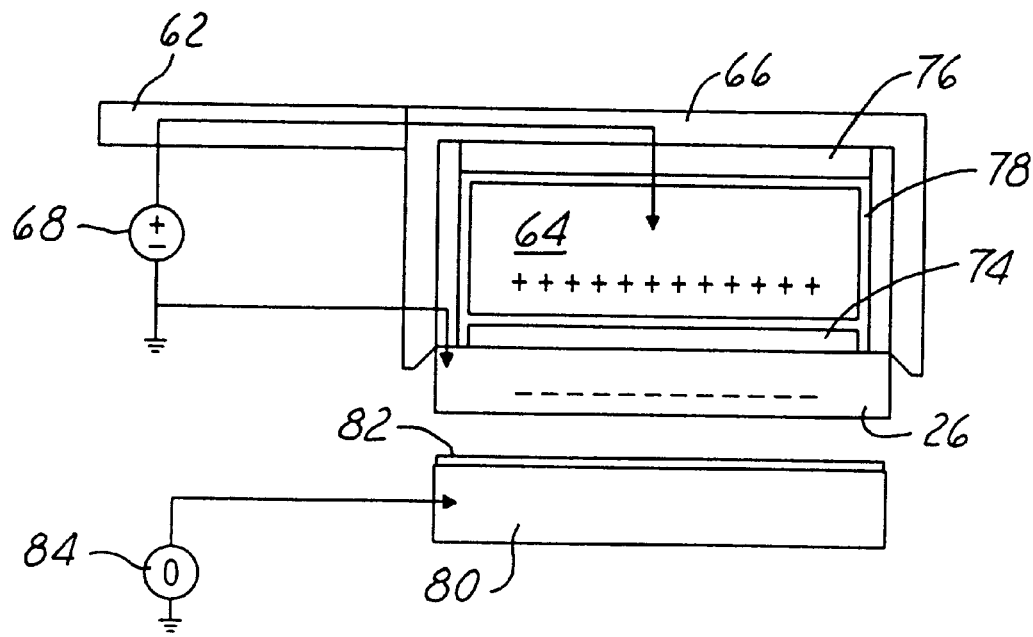
FIG. 10 is a view similar to FIG. 9 but showing the arm having transported the wafer to a staging position, in proximity to the electrode.
Figure 11:
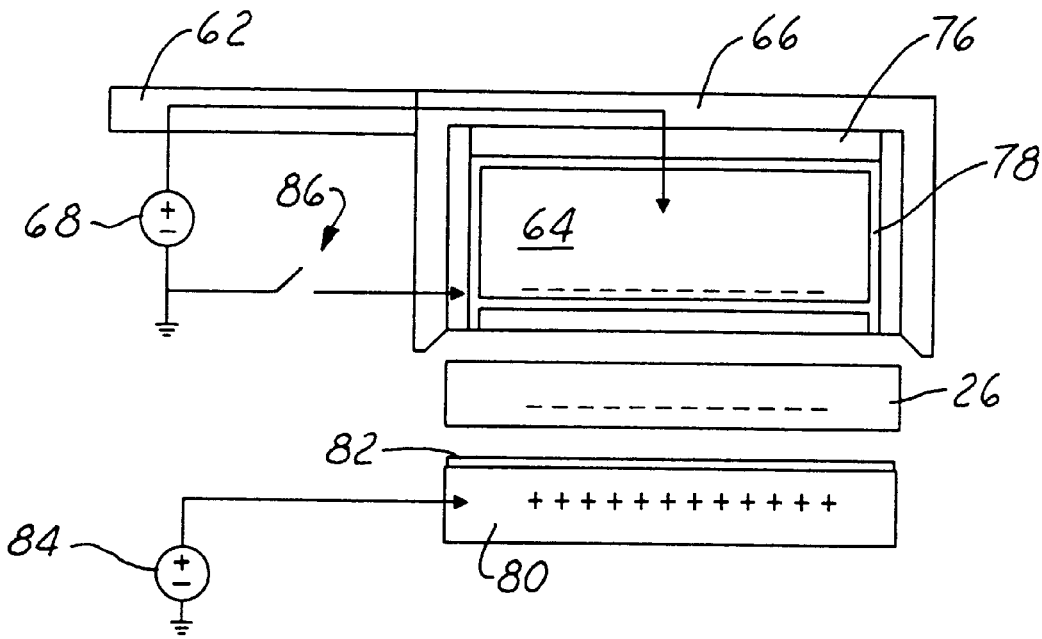
FIG. 11 is a view similar to FIG. 10 but showing a subsequent processing step in which the wafer is released from the arm for deposit onto the electrode.
Figure 12:
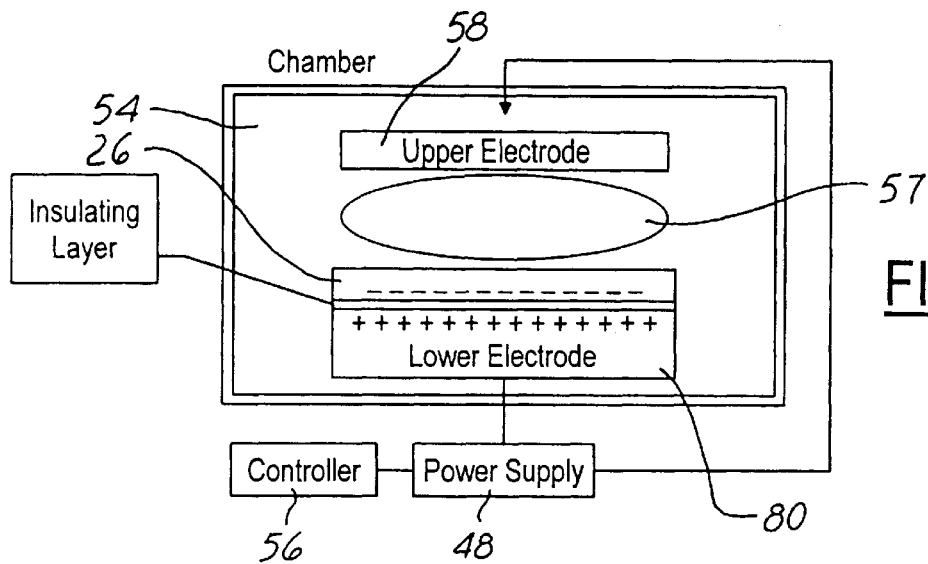
FIG. 12 is a combined block and diagrammatic view of a semiconductor processing chamber.
Figure 13:
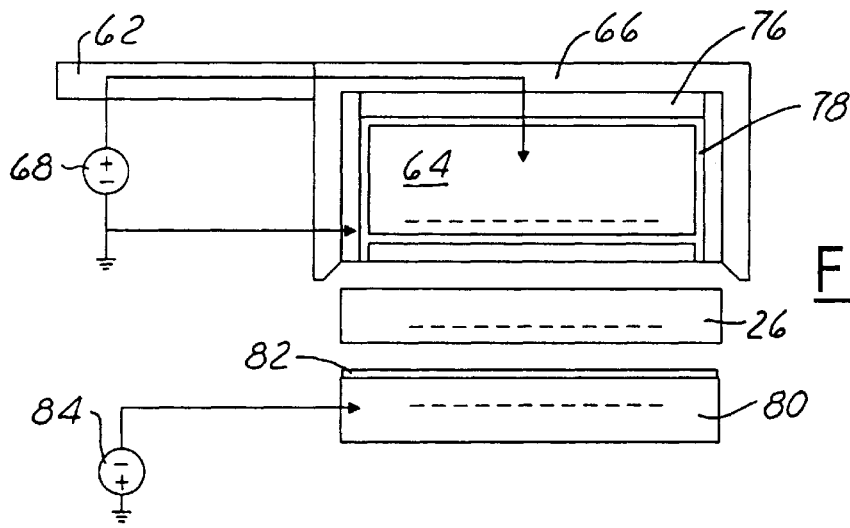
FIG. 13 is a view similar to FIG. 11 but showing a step in which the charge on the electrode and the plate are reversed, in preparation for chucking the wafer onto the arm.
Figure 14:
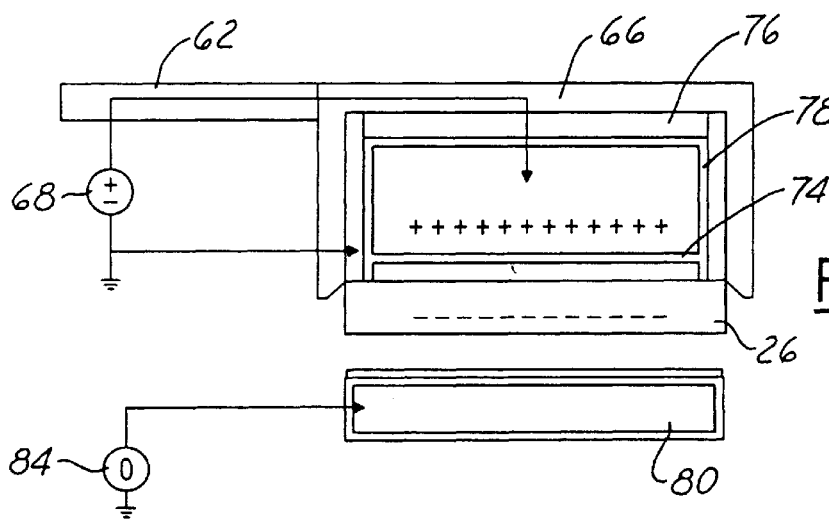
FIG. 14 is a view similar to FIG. 13 but showing a subsequent step in which the arm has removed the wafer from the electrode in preparation for return transport to the staging position.

Referring first to FIGS. 1–7, inclusive, the present invention generally relates to an electrostatic transporting and chucking method which utilizes an electrostatic arm, generally indicated by the numeral 20, for transporting an electrically conductive workpiece, such as the semiconductor wafer 26 between a staging position and a work area within a semiconductor processing chamber 54 (FIG. 5). The staging position may comprise, for example, a cassette or other holding area within a load lock chamber, and the work area within the processing chamber may comprise an electrically conductive substrate, such as an electrode 42 which is employed to electrostatically clamp the wafer 26 in a fixed position within the chamber during processing. The process carried out on the wafer 26 within the chamber may be one of several common processes such as CVD, etching, or sputtering. As will become later apparent, the arm 20 is utilized not only to transport the wafer 26, but also controls the electrostatic charge applied to the wafer 26.

Although not specifically shown herein, it is to be understood that the arm 20 will include any various types of conventional mechanisms to move the arm vertically and horizontally in a rectilinear or curvilinear fashion. The details of such mechanisms depend on the particular application and are well known in the art, consequently they need not be described in detail herein.

Figure 1:
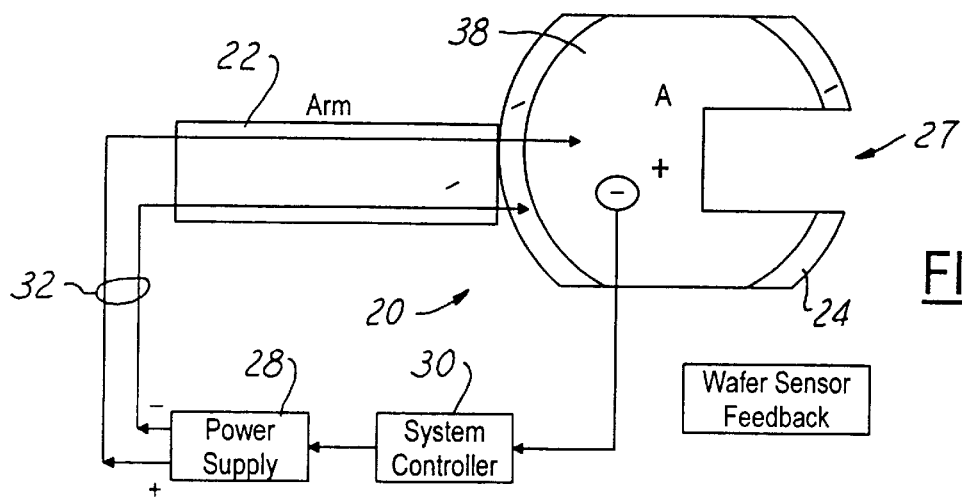
FIG. 1 is a combined block and top plan view of an electrostatic carrier arm used in carrying out the method of the present invention.
Figure 2:
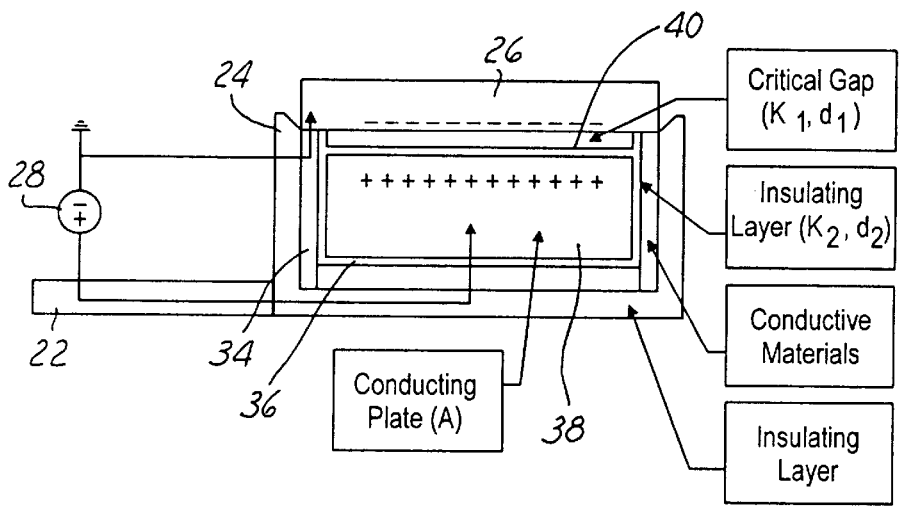
FIG. 2 is a combined schematic and cross-sectional view of the arm of FIG. 1, with a semiconductor wafer loaded thereon.
Figure 3:
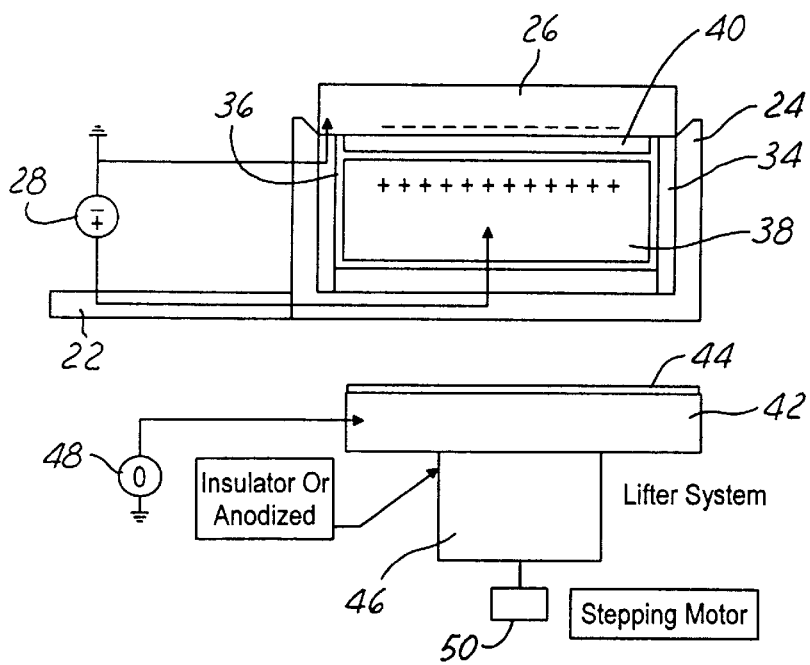
FIG. 3 is a view similar to FIG. 2 but further showing an electrode and a lifting mechanism for transporting the wafer between the electrode and the arm.

The arm 20 includes a elongate arm section 22 connected with a generally cylindrical outer housing 24 provided with an open top and a closed bottom. The arm section 22 and housing 24 are formed of an electrically insulative material, such as plastic for example. Within the outer housing 24, there is sleeved an electrically conductive contact member 34 shaped in the form of a cup having a cylindrical sidewall and a bottom concentrically disposed within the outer housing 24. The upper edge of the contacting member 34 forms a face to face ring contact with the backside face of the wafer 24. In the embodiment shown in FIGS. 1–7, the contact member 34 forms a ring shaped support upon which the circumferential periphery of the wafer 26 rests. As shown in FIG. 2, the upper circumferential edge of the housing 24 is beveled outwardly and extends slightly above the upper edge of the contact member 34 and thus aids in guiding the outer periphery of the wafer 24 into registered engagement with the contact member 34, thus assuring good electrical continuity therebetween.

Concentrically disposed within the contact member 34 is an electrically conductive plate 38 which is separated and electrically insulated from contact member 34 by means of a layer 36 of insulation. The plate 38 is spaced slightly below the upper edge of contact member 34 to form an air gap 40 between such upper face and the bottom or backside face of the wafer 26. The upper surface of plate 38 is also coated with a layer of insulating material.

As best seen in FIGS. 3–6, an electrically conductive substrate in the form of an electrode 42 is disposed within the processing chamber 54 and acts as a chuck body for holding the wafer 26 during processing. The electrode 42 is provided with a layer 44 of electrically insulated material which forms an insulative barrier between the electrode 42 and the wafer 26.

The system includes electrical power supply means comprising a first voltage source 28 coupled with the electrostatic arm 20 by means of a pair of lead wires 32, and a second voltage source 48 coupled with the electrode 42. One of the electrical leads 32 is connected with the contacting member 34, while the other of such leads is coupled with the plate member 38. The system further includes a controller 30 for controlling the power supply 28. The controller 30 includes a series connected switch 52 (FIG. 4) connected between the voltage source 28 and the contact member 34. The controller 30 is operative to selectively connect or disconnect the voltage source from the arm 20, as well as to change the polarity of the leads, and thus the polarity of the electrical charge applied to the contact member 34 and plate 38.

A conventional lifting mechanism 46 formed of an electrically insulative material and driven by a suitable motor source such as stepping motor 50, is disposed beneath the electrode 42. Lifter 46 is operative to transport the wafer 26 between the arm 20 and the electrode 42. When the arm 20 is shifted to its staged position in vertical alignment with the electrode 42, lifter 46 is raised to contact the wafer 26 and lift the latter above the elevation of the arm 20, as best seen in FIG. 4. Stepper motor 50 is then actuated to lower the lifter 46 so that the wafer 26 descends onto the electrode 42. The lifter mechanism 46 is conventional in design and may be placed immediately below the electrode 42, in which case certain components of the arm 20 are provided with a cut away 27 (FIG. 1) to accommodate travel of the lifter 46.

As shown in FIG. 5, the processing chamber 54 houses an upper electrode 58 and a lower electrode 42 upon which the wafer 26 rests. Lower and upper electrodes 42, 58 are coupled with the power supply 48 which in turn is controlled by a second controller 56. A high voltage applied to the lower and upper electrodes 42, 58 ionizes a gas introduced into the chamber 54 to create a gas plasma 57 within the chamber 54 used in processing the wafer 26.

In use, the first step in chucking a wafer 26 for processing consists of moving the electrostatic arm 20 to a cassette or load station (not shown) where a wafer 26 to be processed is present. Controller 30 then turns on the power supply 28 resulting in the application of a voltage to the arm 20 which produces a positive charge on the plate 38 and a negative charge on the contact member 34. The arm 20 and wafer 26 are then relatively moved to place the wafer 26 on the arm 20 such that the outer periphery of the backside of the wafer 26 rests upon the upper edge of the contact member 34. Since contact member 34 is negatively charged, and is in contact with the wafer 26, wafer 26 also becomes negatively charged. Because the plate 38 is positively charged, electrostatic attractive force is created between the wafer 26 and plate 38 which clamps or "chucks" wafer 26 onto the arm 20.

Arm 20 may then be rapidly moved so as to transport the wafer 26 into the process chamber 54, to a position vertically aligned with the electrode 42. At this point, switch 52 (FIG. 4) is opened and the polarity of the voltage supplied by source 28 is reversed, thereby applying a negative charge to the plate member 38. Since wafer 26 carries a residual negative charge, an electrostatic force of repulsion is created between the plate 38 and wafer 26. Motor 50 is actuated to raise lifter 46 until the latter contacts and elevates the wafer 26 above the arm 20, as best seen in FIG. 4. The arm 20 is then retracted away from the chamber, whereupon lifter 46 descends to place the negatively charged wafer 26 upon the electrode 42. Then controller 56 operates the power supply 48 to apply a positive charge to the lower electrode 42 thus clamping or "chucking" the wafer 26 in place within the chamber 56. Backside cooling of the wafer 26 is then commenced, following which the process (CVD, sputtering, etching, etc.) may be started within the chamber 52. As the process is started, a gas plasma 57 is created within the chamber 52 which acts as a conductor to complete a circuit loop between the power supply 48, electrode 42 and wafer 26. The amount of the electrostatic force chucking the wafer 26 onto the electrode 42 may be varied by the controller 56 which operates the voltage to the power supply 48.

After processing of the wafer 26 in the chamber 54 is complete, the plasma within the chamber 54 is no longer present, but the wafer 26 retains a negative residual charge. Controller 56 then reverses the polarity of the power supply 48 (FIG. 6), thus changing the polarity of the charged electrode 42 from positive to negative. With both electrode 42 and wafer 26 negatively charged, an electrostatic repulsion force therebetween is created which "de-chucks" the wafer 26. At this point motor 50 is actuated to cause the lifter 46 to raise the wafer 26 and arm 20 is then again shifted into the chamber and power supply 28 is energized to place a positive charge on the plate 38, and a negative charge on the contact member 34. Lifter 46 is lowered so that wafer 26 is deposited on the arm 20, resulting in the wafer 26 being electrostatically chucked onto the arm 20. The arm 20 is then shifted to transport the processed wafer to the staging position at a load lock or cassette.

Attention is now directed to FIGS. 8–14 which depict an alternate, preferred form of the electrostatic chucking system of the present invention. The system broadly includes an electrostatic arm, generally indicated by the numeral 60 which includes essentially the same components as the arm 20 previously described, except that the components are inverted. More specifically, the arm 60 includes an elongated arm section 62, an outer housing 66 formed of electrically insulated material. A cylindrically shaped contact member 76 is sleeved within the cylindrical body of housing 66, and includes a closed top or end wall, and an open bottom. A plate member 64 is concentrically disposed within the cylindrical contact member 76, and has its lower face spaced from the bottom edge of the contact member 76 to form an air gap 74 between the wafer 26 to be transported and the plate 64. The lower surface of plate 64 is also insulated with insulation material. A layer of electrically insulative material 78 is provided between the plate 64 and the contact member 76. The lower edge of the housing section 66 extends down past the lower edge of contact member 76 and is slightly beveled to assist in bringing the wafer 26 into registered contact with the contact member 76.

While the electrostatic arm 60 shown in FIGS. 8–14 is similar to arm 20 shown in FIGS. 1–7, the system of FIGS. 8–14 does not employ the previously described lifter mechanism, but rather relies on electrostatic chucking of the wafer 26 on the arm 60 and movement of the arm 60 itself to transport the wafer 26 from the staging position directly onto the electrode, designated in FIGS. 8–14 by the numeral 80. As in the case of the previous embodiment, electrode 80 is provided with a layer of insulation 82 which electrically insulates the electrode 80 from the wafer 26. Power supply means are provided comprising first and second voltage sources 68, 84 which respectively apply power to the arm 60 and electrode 80.

The wafer transport sequence using the arm 60 may be described as follows: the arm 60 is first moved to the staging position (cassette or load station) and the arm 60 is then energized by the power source 68 which applies a positive charge to the plate 64 and a negative charge to the contact member 76. The arm 60 is then moved downwardly so the lower edge of the contact member 76 engages the wafer 26. With the plate 64 positively charged, and the wafer 26 negatively charged, via the negatively charged contact member 76, the wafer 26 is electrostatically chucked and therefore clamped onto the arm 60. The arm 60 then moves into the chamber 54 and downwardly to place the negatively charged wafer 26 onto the electrode 80. Switch 86 is open to remove power from the arm 60, whereupon the plate 64 reverses charge from positive to negative, thus releasing the negatively charged wafer 26. Power supply 84 is then actuated to apply a positive charge to the electrode 80 which attracts and therefore electrostatically chucks the negatively charged wafer 26 onto the electrode 80.

The arm 60 is then shifted out of the chamber following which back side cooling is provided to the wafer 26 and the process within the chamber 54 may be commenced. Again, a gas plasma 57 is created within the chamber 54 and the process (CVD, sputtering, etching, etc.) is carried out during which time the plasma again acts as a conductor closing a circuit loop between the power supply 84, electrode 80 and wafer 26. As in the previously described embodiment, the controller 56 controls the voltage output by the power supply which in turn determines the magnitude of the electrostatic chucking force applied to the wafer 26. Upon completion of the process, the plasma is terminated but the negative charge remains in the wafer 26. The arm 60 is then moved into the chamber, and down into close proximity to the wafer 26. Power is applied to the arm 60 so that the plate 64 is positively charged and the contacting member 76 is negatively charged, thereby creating an electrostatic attractive force which chucks the wafer 26 onto the arm 60. Simultaneously, controller 56 operates the power supply 84 so that the charge on electrode 80 is reversed from positive to negative. With the wafer 26 held on the arm 60, arm 60 is retracted from the chamber to transport the wafer 26 back to the load lock or cassette. Power supply 84 may then be turned off.

The method of the present invention is substantially different from that employed in prior art techniques using electrostatic chucks. The steps employed in the prior art technique consisted of the following:

1. Load wafer onto the electrode with a mechanical arm.
2. Unload the wafer to the electrostatic chuck using a lifter.
3. Create a plasma in the chamber using a low power level.
4. Apply power to the electrostatic chuck (thus charging the wafer).
5. Clamp the wafer.
6. Bleed cooling gas on to the wafer for backside cooling.
7. Turn off the low power plasma.
8. Commence process in the chamber.
9. End process in the chamber.
10. Stop backside cooling of the wafer.
11. Create a low power plasma.
12. Remove power from the electrostatic chuck.
13. Turn off the low power plasma.
14. Unload the wafer to load lock using a mechanical arm.

From the foregoing, it is apparent that the prior art method required the presence of a low power plasma to chuck and de-chuck the wafer onto the electrode. In contrast, the use of electrostatic arm according to the method of the present invention eliminates the need for using a low power plasma in order to charge and un-charge the wafer. By using an electrostatic arm to charge and un-charge the wafer during transport of the wafer, precious processing time is saved, since the additional steps of creating a low power plasma and then eliminating the same are no longer required.

In contrast to the prior art method described above, the method of the present invention broadly consists of the following steps:

1. Load wafer onto the electrode using the electrostatic arm.
2. Open a circuit between the electrostatic arm and the wafer.
3. Reverse the charges on the electrostatic arm to repel the wafer and apply power to the electrostatic chuck in order to attract the wafer.
4. Clamp the wafer onto the electrode.
5. Commence backside cooling of the wafer.
6. Commence processing in the chamber.
7. End processing in the chamber.
8. Terminate backside cooling of the wafer.
9. Move the electrostatic arm into close proximity to the electrode.
10. Apply power to the electrostatic arm in order to attract the wafer while reversing the charges on the electrostatic chuck to repel wafer.
11. Electrostatically chuck the wafer onto the arm and move the wafer back to load lock using the arm.

From the foregoing, it is apparent that the inventive method described above not only provides for the reliable accomplishment of the objects of the invention, but does so in a particularly simple and economic manner. It is recognized, of course, that those skilled in the art may make various modifications and additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of transporting and electrostatically chucking a semiconductor wafer for processing in a chamber, comprising the steps of:

(A) providing an electrostatically conductive carrier with a downwardly directed contact face charging said electrically conductive carrier with a first electrical polarity;

(B) charging said wafer with a second electrical polarity opposite said first polarity;

(C) loading said wafer onto said downwardly directed contact face of said carrier by positioning said carrier above said wafer and picking up said wafer using an electrostatic force between said carrier and said wafer as generated by the polarities established in steps A and B;

(D) transporting said wafer from a staging area to said processing chamber area using said carrier;

(E) charging an electrically conductive substrate within said chamber with said first electrical polarity;

(F) loading said wafer charged in step (B) onto said charged substrate by locating said carrier over said substrate and releasing said wafer from said carrier so as to drop said wafer downwardly onto said substrate;

(G) holding said wafer on said substrate using an electrostatic force;

(H) following processing of said wafer in said chamber, suspending said wafer on said substrate by reversing the polarity of the electrical charge on said substrate, whereby to create an electrostatic repulsion force between said wafer and said substrate;

(I) loading said wafer onto said carrier by picking up said wafer using the attractive force between said carrier and said wafer; and, (J) transporting said wafer from said processing chamber area to said standby area using said carrier.

2. The method of claim 1, wherein step (A) is performed by lowering said carrier into contact with said wafer, and suspending said wafer on said carrier using an electrostatic force.

3. The method of claim 1, wherein step (F) includes the substep of reversing the polarity of the charge on said carrier, whereby to create an electrostatic force repelling said wafer from said carrier.

4. The method of claim 1, including the step of, after step (J), releasing the wafer from said carrier by reversing the polarity of the charge on said carrier, whereby to create an electrostatic force repelling said wafer from said carrier.

* * * * *